United States Patent
Yamamoto et al.

(10) Patent No.: US 8,270,567 B2
(45) Date of Patent: Sep. 18, 2012

(54) X-RAY IMAGING DEVICE AND X-RAY RADIOGRAPHIC APPARATUS

(75) Inventors: Toshiyoshi Yamamoto, Kanagawa (JP); Yoshihiro Ino, Kanagawa (JP)

(73) Assignee: Panasonic Corporation, Osaka (JP)

( * ) Notice: Subject to any disclaimer, the term of this patent is extended or adjusted under 35 U.S.C. 154(b) by 390 days.

(21) Appl. No.: 12/597,057

(22) PCT Filed: Apr. 25, 2008

(86) PCT No.: PCT/JP2008/001099
§ 371 (c)(1), (2), (4) Date: Oct. 22, 2009

(87) PCT Pub. No.: WO2008/136188
PCT Pub. Date: Nov. 13, 2008

(65) Prior Publication Data
US 2010/0128845 A1 May 27, 2010

(30) Foreign Application Priority Data
Apr. 26, 2007 (JP) .................................. 2007-116939

(51) Int. Cl.
*G01N 23/04* (2006.01)
*H05G 1/64* (2006.01)

(52) U.S. Cl. ........................................ 378/62; 378/98.8

(58) Field of Classification Search ................. 378/98.9, 378/189–191, 62, 19
See application file for complete search history.

(56) References Cited

U.S. PATENT DOCUMENTS

| | | | |
|---|---|---|---|
| 5,117,114 A | 5/1992 | Street et al. | |
| 5,515,411 A | 5/1996 | Tonami et al. | |
| 6,042,267 A | 3/2000 | Muraki et al. | |
| 6,078,643 A * | 6/2000 | Vogelsong et al. | 378/98.2 |
| 6,559,451 B1 | 5/2003 | Izumi et al. | |
| 2002/0036599 A1* | 3/2002 | Nishimura et al. | 345/11 |

(Continued)

FOREIGN PATENT DOCUMENTS

CN 1211413 3/1999

(Continued)

OTHER PUBLICATIONS

International Preliminary Report on Patentability issued Nov. 19, 2009 in International (PCT) Application No. PCT/JP2008/001099.

(Continued)

*Primary Examiner* — Irakli Kiknadze
(74) *Attorney, Agent, or Firm* — Wenderoth, Lind & Ponack, L.L.P.

(57) ABSTRACT

An X-ray imaging device includes an X-ray detection section, a cold electron source, and a light-shielding coating layer. The X-ray detection section includes an X-ray conversion layer made of an X-ray converter material which generates electric charges upon incidence of an X-ray, a first charge injection blocking layer formed on an incidence surface of the X-ray conversion layer, and a second charge injection blocking layer formed on a rear surface of the X-ray conversion layer. The cold electron source has a plurality of electron emission sections arranged in a matrix form, each of the electronic emission sections being capable of emitting electrons toward the second charge injection blocking layer of the X-ray detection section. The light-shielding coating layer blocks incidence of the visible light into the X-ray detection section.

11 Claims, 9 Drawing Sheets

U.S. PATENT DOCUMENTS

| | | |
|---|---|---|
| 2003/0096445 A1 | 5/2003 | Izumi et al. |
| 2006/0067464 A1* | 3/2006 | Clinthorne et al. ............. 378/38 |
| 2006/0072427 A1 | 4/2006 | Kanda et al. |

FOREIGN PATENT DOCUMENTS

| | | |
|---|---|---|
| CN | 1745431 | 3/2006 |
| DE | 198 16 204 | 10/1998 |
| FR | 2 608 842 | 6/1988 |
| JP | 7-335927 | 12/1995 |
| JP | 10-282243 | 10/1998 |
| JP | 2000-48743 | 2/2000 |
| JP | 2001-148475 | 5/2001 |
| WO | 2004/114314 | 12/2004 |

OTHER PUBLICATIONS

International Search Report issued Jun. 3, 2008 in International (PCT) Application No. PCT/JP2008/001099.

Yoshihiro Izumi et al, "Development of Flat Panel X-Ray Image Sensor", Sharp Technical Report No. 80, p. 25-p. 30, Aug. 2001, Sharp Co., Ltd. (along with partial English translation).

Supplementary European Search Report issued Nov. 8, 2010 in Application No. EP 08 75 1624.

* cited by examiner

X-RAY IMAGING DEVICE AND X-RAY RADIOGRAPHIC APPARATUS

TECHNICAL FIELD

The present invention relates to an X-ray imaging device suitable for X-ray photography in a medical diagnostic field such as for medical department and dental department.

BACKGROUND ART

FIG. 13 shows a conventional X-ray imaging device 101 suitable for X-ray photography in the medical diagnostic field. The X-ray imaging device 101 includes an X-ray conversion layer 102 made of an X-ray converter material including amorphous selenium (a-Se) and a thin-film transistor (TFT) array 103. An incident X-ray is converted into electric charges in the X-ray conversion layer 102, and the electric charges are read by the TFT array 103 to provide an X-ray image. Such devices as the X-ray imaging device 101 are disclosed in JP2001-148475 A and "Development of Flat Panel X-Ray Image Sensor" (Yoshihiro Izumi et al, Sharp Technical Report No. 80, P25-P30, August 2001, Sharp Co., Ltd.).

The detection efficiency or sensitivity of an X-ray image in the X-ray imaging device depends on the amount of charges produced by converting an X-ray in the X-ray conversion layer. In the conventional X-ray imaging devices including the one shown in FIG. 13, the amount of energy detectable as an image is only about 70% at the maximum of the total X-ray energy incident into the surface of the X-ray imaging devices.

The X-ray photography in the medical diagnosis field is strongly required to reduce the exposure of a subject. Therefore, it is most important for the X-ray imaging devices applied to the medical diagnosis field to find the solution to a problem of how to enhance the sensitivity in order to reduce the exposure of a subject.

DISCLOSURE OF THE INVENTION

Problems to be Solved by the Invention

An object of the present invention is to provide an X-ray imaging device with substantially enhanced sensitivity particularly in order to considerably reduce the exposure of a subject at the time of X-ray photography in the medical diagnosis field.

Means for Solving the Problems

In this description, the term "X-ray" is used to refer to electromagnetic waves generated by change of state of electrons in an atom, the electromagnetic waves including at least those having a wavelength of approximately 1 pm to 10 nm.

A first aspect of the present invention provides an X-ray imaging device, comprising: an X-ray detection section including an X-ray conversion layer having a first surface into which an X-ray enters and a second surface opposite to the first surface and made of an X-ray converter material for generating electric charges upon incidence of the X-ray, a first charge injection blocking layer formed on the first surface of the X-ray conversion layer, and a second charge injection blocking layer formed on the second surface of the X-ray conversion layer; a cold electron source having a plurality of electron emission sections arranged in a matrix form, each of the electronic emission sections being capable of emitting electrons toward the second charge injection blocking layer of the X-ray detection section; a light-shielding section for shielding visible light from entering into the X-ray detection section; a voltage application section for applying a voltage to the X-ray conversion layer of the X-ray detection section to generate an electric field which induces avalanche multiplication; an electron source drive section for driving a plurality of the electron emission sections of the cold electron source in sequence so that electrons are emitted; and a read section for electronically detecting electric charges generated by incidence of the X-ray into the X-ray conversion layer and then neutralized by the electrons emitted from the electron emission sections.

In the X-ray conversion layer of the X-ray detection section, electric charges generated by the incidence of an X-ray are multiplied by avalanche multiplication. The incidence of visible light into the X-ray detection section is blocked by the light-shielding section. Therefore, with this configuration, X-ray image applied to the X-ray detection section can be electronically detected as an image data with extremely high sensitivity without an influence of disturbance by visible light and the like, achieving considerable reduction in the exposure of a subject in the X-ray photography in the medical diagnosis field.

The X-ray converter material includes amorphous selenium for example.

Amorphous selenium already has been widely used as a photoelectric conversion material which converts visible light into an electric charge. Accordingly, using amorphous selenium as the X-ray converter material for the X-ray conversion layer enables application of known manufacturing methods, resulting in easy implementation of a high sensitivity X-ray imaging device.

A ballistic electron surface-emitting device can be employed as the cold electron source.

Used as the ballistic electron surface-emitting device is a Nanocrystalline Poly-Silicon Layer (NPS layer) formed like a film, which is structured to have a large number of fine chain-shaped structures made of nanocrystalline silicon layers and placed between pillar-shaped polysilicon structures. Since the NPS layer can be manufactured by applying anodising and low-temperature oxidation process to the polysilicon layer, upsizing can easily be achieved. Therefore, employing the ballistic electron surface-emitting device can achieve a large-area X-ray imaging device having a large imaging region.

A Spindt-type electron source can be employed as the cold electron source.

Since the density of an emitter which functions as an electron emission section can be increased with the Spindt-type electron source being used as a cold electron source, an image of higher fineness can be provided by the X-ray imaging device.

More specifically, the light-shielding section is a light-shielding coating layer made of a light-shielding resin material, the light-shielding coating layer being formed so as to cover at least a side of the X-ray detection section which is the first surface side into which the X-ray enters.

Alternatively, the light-shielding section may be a light-shielding casing made of a light-shielding material for housing at least the X-ray detection section and the cold electron source therein.

The voltage application section favorably generates an average electric field of between $0.1 \times 10^8$ V/m and $0.6 \times 10^8$ V/m in the X-ray conversion layer of the X-ray detection section.

With this configuration, the X-ray imaging device can be controlled with high sensitivity and with practical operating voltage.

A second aspect of the invention provides an X-ray radiographic apparatus, comprising: the above-mentioned X-ray imaging device; a moving section for spatially moving the X-ray imaging device; and an X-ray irradiation section placed on an opposite side of the X-ray imaging device with respect a photographing target for irradiating the photographing target with an X-ray and making the transmitted X-ray enter into the imaging device.

This configuration can achieve a practical X-ray radiographic apparatus which can perform X-ray photography with high sensitivity while moving an X-ray imaging device spatially. Particularly, in the case of the X-ray photography in the medical diagnosis field, where a photographing target is a human body, the X-ray radiographic apparatus allows considerable reduction in the exposure of a subject.

Effects of the Invention

In this invention, with a combination of the X-ray detection section, which includes charge injection blocking layers formed on both the sides of the X-ray conversion layer made of an X-ray converter material, the cold electron source having a plurality of electron emission sections placed in a matrix form, and the light-shielding section for shielding incidence of visible light, a X-ray imaging device with extremely high sensitivity without being influenced by disturbance by visible light and the like can be achieved. Applying the X-ray imaging device to the X-ray photography in the medical diagnosis field allows considerable reduction in the exposure of a subject at the time of photographing.

DESCRIPTION OF REFERENCE SIGNS

Best Mode for Carrying Out the Invention

The embodiments of the invention will now be described with reference to the accompanying drawings.

First Embodiment

Figure 1:
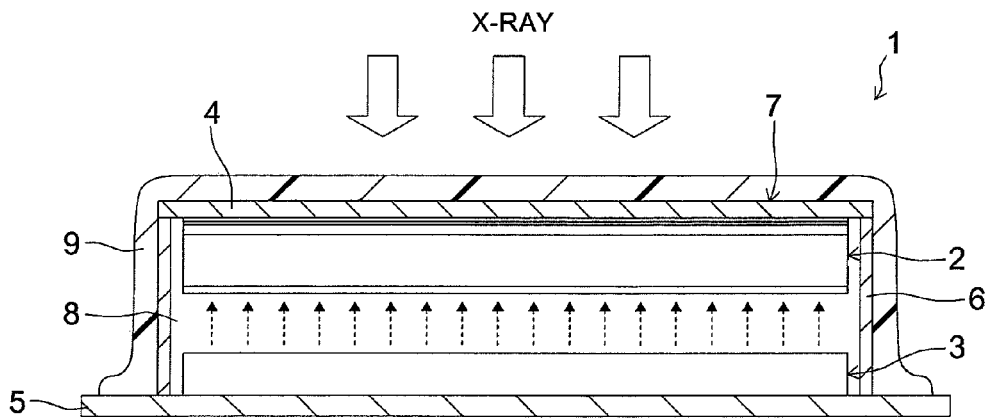
FIG. 1 is a schematic cross sectional view of an X-ray imaging device according to a first embodiment of the invention.
Figure 2:
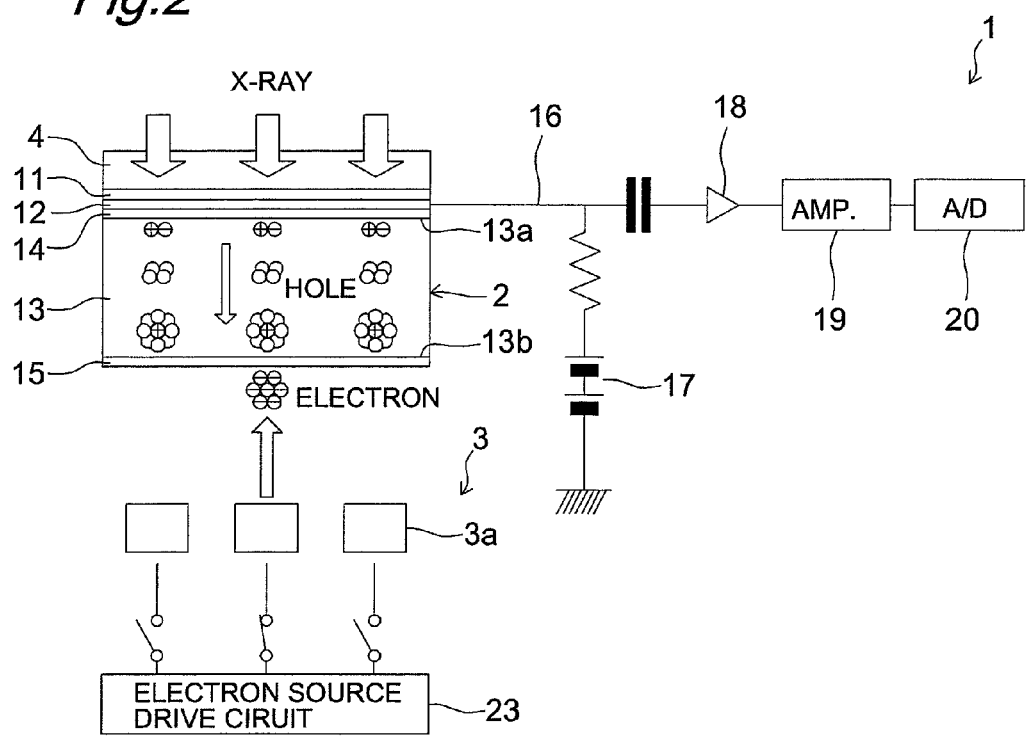
FIG. 2 is an explanatory view showing an operation principle of the X-ray imaging device according to the first embodiment of the invention.
Figure 3:
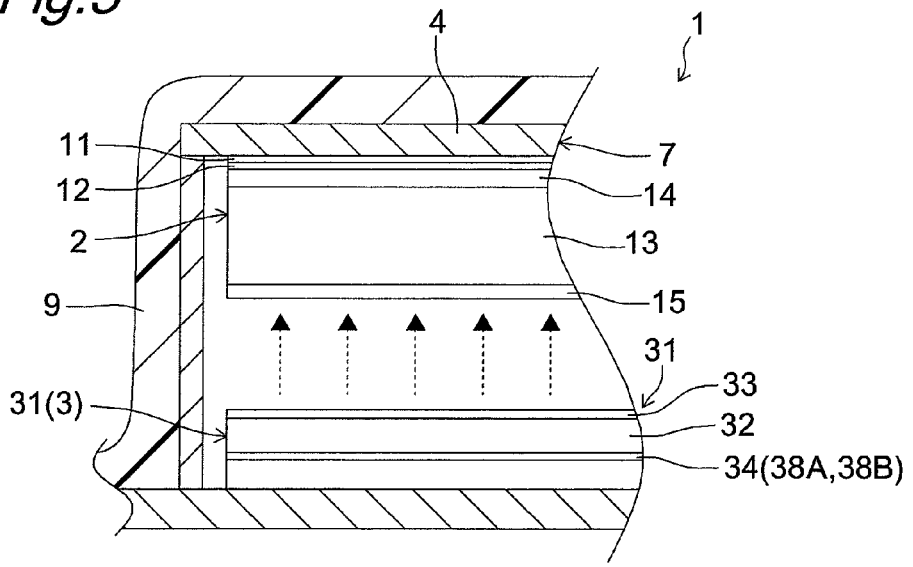
FIG. 3 is a schematic partially enlarged cross sectional view of the X-ray imaging device of the first embodiment with a cold electron source being a BSD.

FIGS. 1 and 2 show an X-ray imaging device 1 according to a first embodiment of the invention. The X-ray imaging device 1 includes an X-ray detection section 2, a cold electron source 3, and a light-shielding coating layer 9.

The X-ray detection section 2 is formed on a face plate 4 made of aluminum, glass and the like, while the cold electron source 3 is formed on a base plate 5 placed with a distance from the face plate 4. The face plate 4 and the base plate 5 may be made of any material including aluminum and glass. A side plate 6 which is made of such materials as ceramics is provided between the face plate 4 and the base plate 5. The face plate 4, the base plate 5, and the side plate 6 constitute a device casing 7. The device casing 7 accommodates the X-ray detection section 2 and the cold electron source 3 therein. The X-ray detection section 2 and the cold electron source 3 are opposed to each other with a vacuum space 8 interposed therebetween in the device casing 7.

An insulating layer 11 and an electrode layer 12 which is made of indium tin oxide (ITO) and the like are provided between the X-ray detection section 2 and the face plate 4. An X-ray enters into the X-ray detection section 2 from the face plate 4 side.

The X-ray detection section 2 has an X-ray conversion layer 13 which is made of an X-ray converter material including amorphous selenium (a-Se). The X-ray converter material is not limited to amorphous selenium and may be cadmium tellurium (CdTe) or other materials. A first charge injection blocking layer 14 which is made of cerium oxide ($CeO_2$) is formed on an incidence surface (first surface) 13a of the X-ray conversion layer 13 into which an X-ray enters. A second charge injection blocking layer 15 which is made of antimony trisulfides ($Sb_2S_3$) is formed on the rear surface (second surface) 13b of the X-ray conversion layer 13 on the opposite side of the incidence surface 13a. The X-ray detection section 2 is known as HARP (High-gain Avalanche Rushing amorphous Photoconductor) in the field of imaging of visible light.

The electrode layer 12 is electrically connected to a conductive line 16, via which voltage is supplied from a voltage application circuit 17. The conductive line 16 is also connected to an amplification circuit 19 and an A/D conversion circuit 20 via a readout circuit 18.

FIGS. 1 and 2 schematically show the cold electron source 3. The specific configuration of the cold electron source 3 will be described later in detail with reference to FIGS. 3 to 8. The cold electron source 3 has a large number of electron emission sections 3a which can emit electrons toward the X-ray detection section 2. A large number of these electron emission sections 3a are arranged in an array or a matrix form seen from the incidence direction of the X-ray. An electron source drive circuit 23 sequentially drives the electron emission sections 3*a* so that electrons are emitted. The specific configuration of the electron source drive circuit 23 will also be described later in detail.

In the present embodiment, a light-shielding coating layer 9 is formed to cover the surface (upper surface in FIG. 1) of the face plate 4, the surface being opposite to the surface having the X-ray detection section 2 formed thereon, and also covers the external surface of the side plate 6 so that the inside of the device casing 7 is sealed. The light-shielding coating layer 9 is made of a light-shielding resin which transmits an X-ray but shields visible light. This kind of light-shielding-resin material includes, for example, black urethane resin and silicon resin. The light-shielding coating layer 9 needs to cover at least the incidence surface side of the X-ray detection section 2. Selection of the light-shielding resin material used as the light-shielding coating layer 9 and the thickness of the light-shielding coating layer 9 need to be so set as to ensure that incidence of the visible light into the X-ray detection section 2 is shielded.

Hereinafter, description will be given of the operation and the principle of the X-ray imaging device 1 in this embodiment.

First, when the surface of the X-ray detection section 2 is irradiated with an X-ray (X-ray image which transmitted a subject), pairs of electrons and electron holes corresponding to the dose of an X-ray, which passed the first charge injection blocking layer 14 and entered into the X-ray converter material, are generated inside the X-ray converter material which constitutes the X-ray conversion layer 13. The generated electron holes are accelerated by an intense electric field applied to the X-ray detection section 2 by the voltage application circuit 17, and collide in sequence with atoms within the X-ray converter material to produce new pairs of electrons and electron holes like avalanche, resulting in multiplication of the number of pairs of electrons and electron holes. This phenomenon is known as avalanche multiplication. The avalanche multiplication forms positive charge patterns multiplied tenfold or more in proportion to the incident X-ray image on the rear surface 13*b* (cold electron source 3 side) of the X-ray conversion layer 13. The voltage applied by the voltage application circuit 17 to the X-ray detection section 2 needs to be set so that an electric field is generated with intensity sufficient for the avalanche multiplication to occur in the X-ray conversion layer 13. Practical use of the avalanche multiplication phenomenon is found in an ultrahigh sensitivity imaging camera (so-called High-gain Avalanche Rushing amorphous Photoconductor (HARP) camera) with use of photoelectric conversion materials in the field of visible light, the HARP camera being reported to have photographing sensitivity of 10 times or more of the usual CCD camera.

It is known that most X-ray converter materials generally have sensitivity also to general visible light. Therefore, in the case where the X-ray converter material is exposed to visible light when an X-ray image applied to the X-ray detection section 2 is to be detected, the visible light around the X-ray image, which is an original detection target, is also converted into electric charges together with the X-ray image, and this visible light acts as a disturbance factor to cause lowered S/N ratio of image signals. However, in the X-ray imaging device 1 in this embodiment, the X-ray detection section 2 is covered with the light-shielding coating layer 9 so as to prevent incidence of the visible light into the X-ray converter material, and therefore an influence of the visible light at the time of X-ray image detection can be prevented. As a result, it becomes possible to prevent the influence of the visible light at the time of X-ray photography, resulting in sufficient X-ray image with less disturbance.

Electrons are emitted from the electron emission sections 3*a* of the cold electron source 3 toward the X-ray detection section 2 (rear surface 13*b* of the X-ray conversion layer 13). These electrons and the electron holes generated within the X-ray conversion layer 13 face each other across the second charge injection blocking layer 15, and the level of electric charges neutralized therebetween is electronically detected, so that image signals representing the X-ray image are loaded onto the readout circuit 18. More specifically, a large number of the electron emission sections 3*a* arranged in a matrix form as mentioned before are sequentially driven to emit electrons, so that the level of electric charges generated by X-ray irradiation is serially read one by one in every area (pixel) corresponding to the respective electron emission sections 3*a* of the X-ray conversion layer 13. In other words, the charge pattern generated in the X-ray conversion layer 13 is scanned by sequentially driving the electron emission sections 3*a* of the cold electron source 3.

In the X-ray conversion layer 13 of the X-ray detection section 2, electric charges generated by the incidence of an X-ray are multiplied by avalanche multiplication as mentioned before. Moreover, the incidence of visible light into the X-ray detection section 2 is shielded by the light-shielding coating layer 9. Therefore, in the X-ray imaging device in this embodiment, it becomes possible to electronically detect an X-ray image applied to the X-ray detection section 2 as image data with extremely high sensitivity without an influence of disturbance by visible light and the like. Applying the X-ray imaging device 1 of this embodiment to X-ray photography in the medical diagnosis field allows drastic reduction in the X-ray dosage applied to a subject, as a result of which the exposure of the subject can be reduced.

In this embodiment, incidence of visible light into the X-ray imaging device 1 is prevented by the light-shielding coating layer 9 which is made of light-shielding resin material. Accordingly, the visible light can be blocked with a relatively easy step. Moreover, sufficient sealability within the device casing 7, as well as high moisture resistance and durability are achieved.

FIGS. 3 to 6 show the more specific configuration of the X-ray imaging device 1 of this embodiment with a Ballistic electron Surface-emitting Device (BSD) 31 employed as the cold electron source 3.

The BSD 31 includes a Nanocrystalline Poly-Silicon Layer (NPS layer) 32, a upper electrode 33 which is constituted of a single thin film made of metal such as gold and which is formed on the electronic emission surface 32*a* side of the NPS layer 32, and a lower electrode 34 formed on a rear surface 32*b* opposite to the electronic emission surface 32*a*. The BSD 31 is formed on a substrate 35 made of glass and the like.

Figure 5:
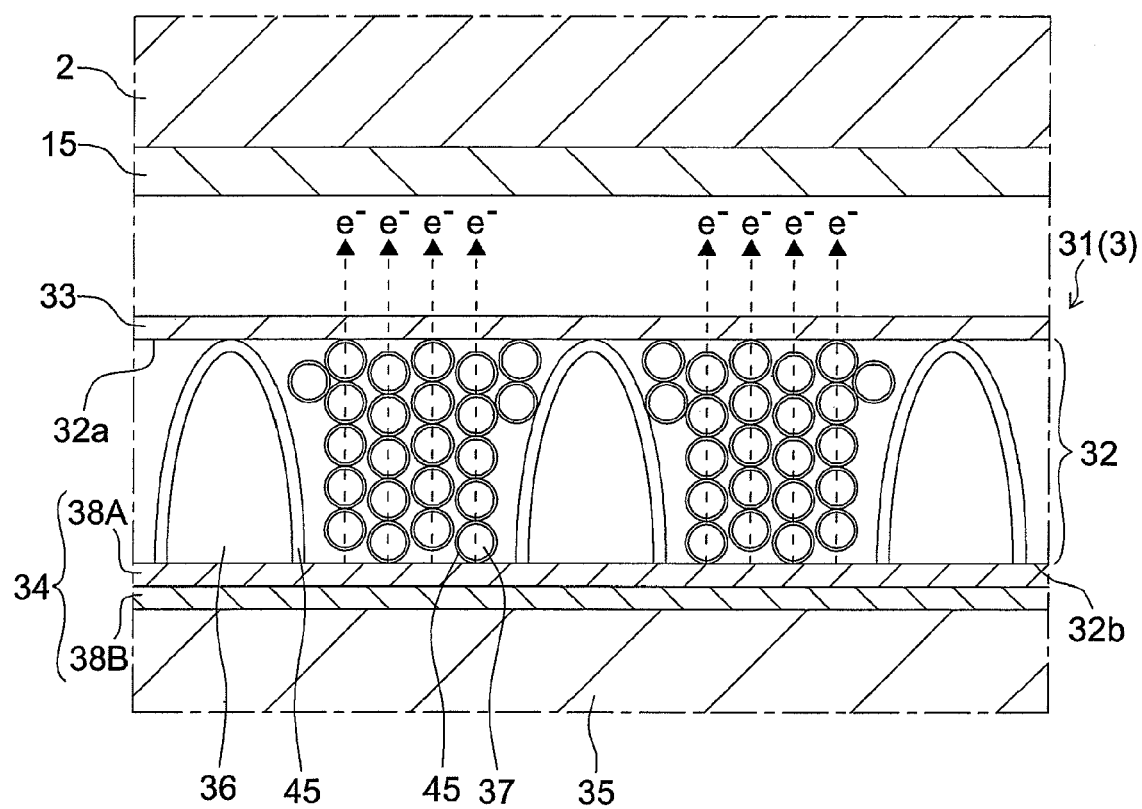
FIG. 5 is a schematic partially enlarged cross sectional view of the BSD.

With reference to FIG. 5, the NPS layer 32 is formed like a film, which is structured to have a large number of fine chain-shaped structures made of nanocrystalline polysilicons 37, each having a diameter of about 5 nm, and formed between pillar-shaped polysilicons 36. Each surface of the pillar-shaped polysilicons 36 and the nanocrystalline polysilicons 37 is covered with an oxide 45 made of $SiO_2$ and the like.

Figure 6:
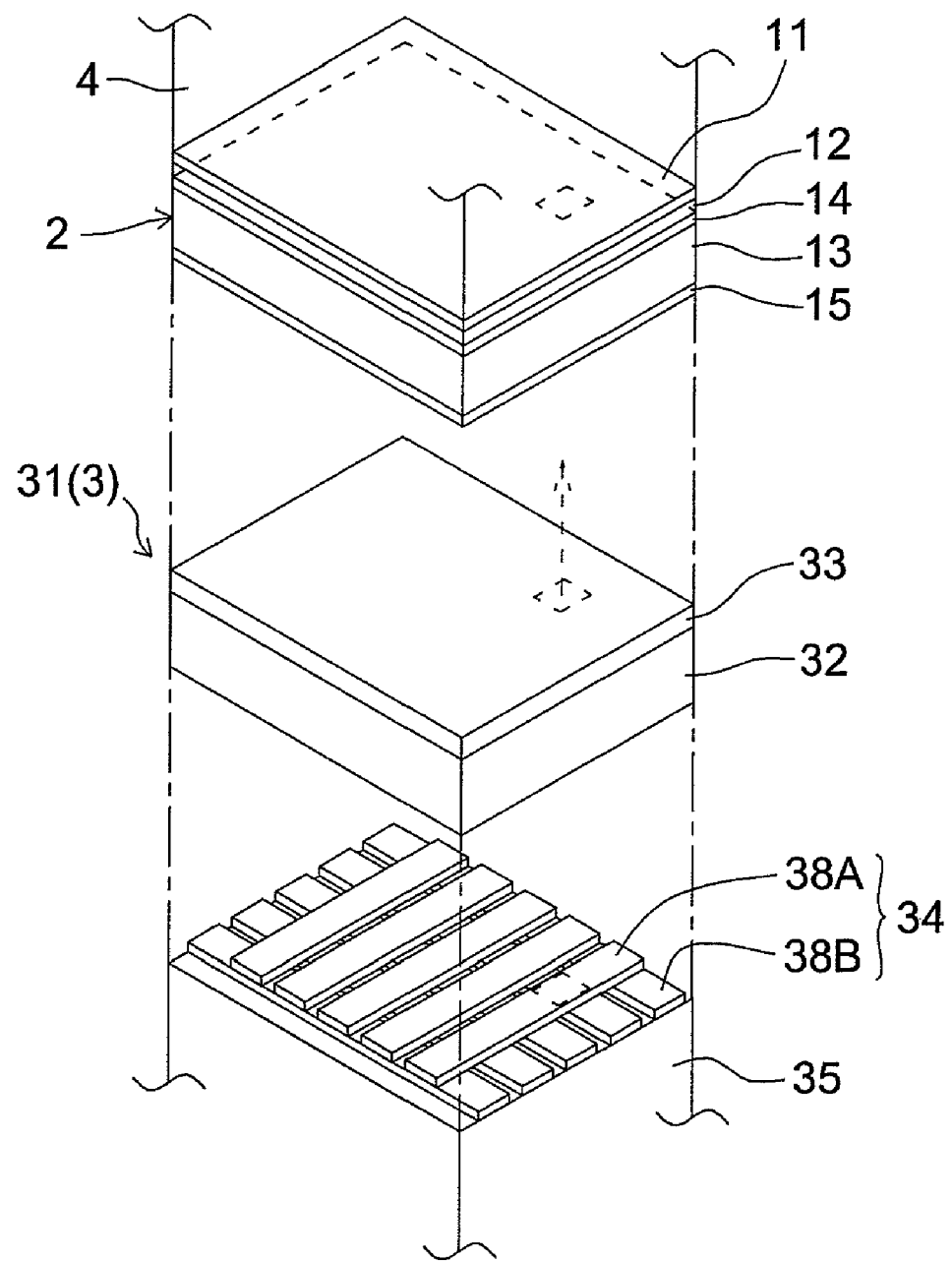
FIG. 6 is an exploded perspective view of the BSD and an X-ray detection section.

As shown only in FIG. 6, the lower electrode 34 has a plurality of strip electrodes 38A placed in a row direction with a distance from each other and a plurality of strip electrodes 38B extending in a column direction orthogonal to these strip electrodes 38A. Areas of the NPS layer 32 located between intersections of two kinds of electrodes, the strip electrodes 38A and 38B, and the upper electrode 33 function as electron emission sections 3a as shown in FIGS. 1 and 2.

Figure 4:
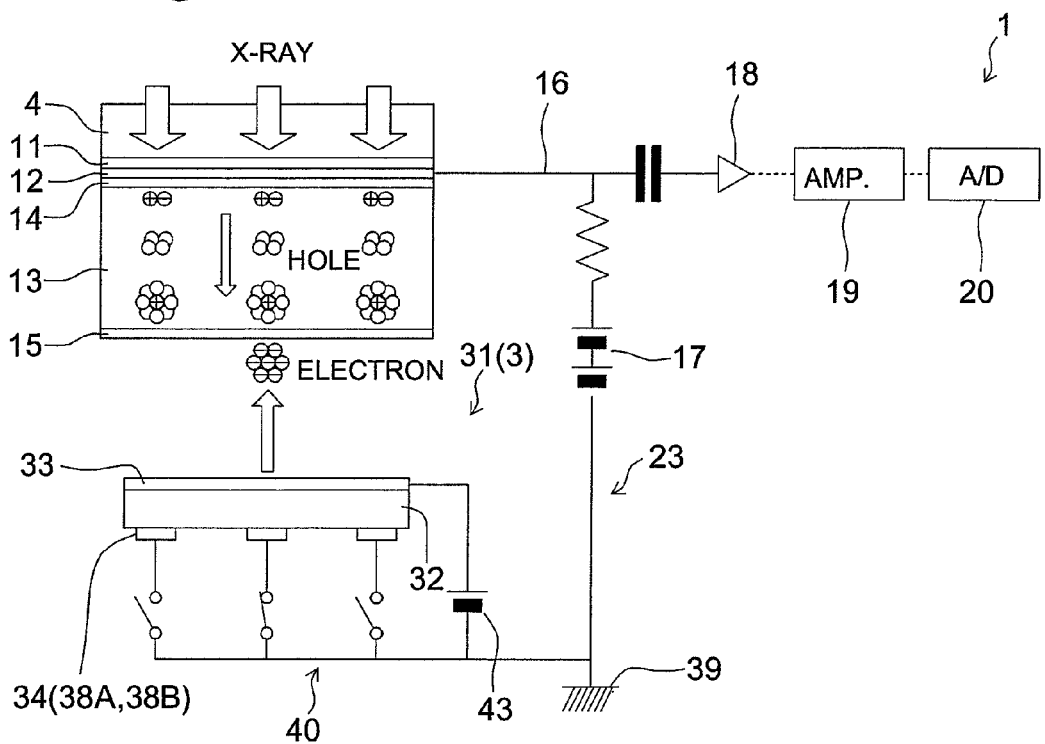
FIG. 4 is an explanatory view showing an operation principle of an X-ray imaging element with a cold electron source being a BSD.

With reference to FIG. 4, the electron source drive circuit 23 has a switching circuit 40 in order to sequentially connect the intersections of the strip electrodes 38A and 38B, which constitute the lower electrode 34, to a ground 39. In other words, the switching circuit 40 executes the address of each pixel. The electron source drive circuit 23 includes a voltage application circuit 43 which applies voltage to the upper electrode 33 of the BSD 31.

Upon injection of electrons into the NPS layer 32 from the lower electrode 34, most voltage applied to between the lower electrode 34 and the upper electrode 33 is to be applied onto the oxide 45 on the surface of the nanocrystalline polysilicon 37, so that an intense electric field area is formed therein. The electrons generated in the lower part of the NPS layer 32 are then accelerated to have increased kinetic energy whenever they pass the oxide 45 of the nanocrystalline polysilicon 37. The accelerated electrons are emitted through the upper electrode 33 and reach the surface of the second charge injection blocking layer 15 of the X-ray detection section 2.

The BSD 31 formed on the substrate 35 such as glass has an advantage that an electron source having larger area than other cold electron sources formed on a semiconductor substrate can be achieved. In short, employing a BSD as the cold electron source makes it easy to achieve the high-sensitivity X-ray imaging device 1 of this embodiment to have a larger area without being influenced by the disturbance by visible light and the like as described before, resulting in increased practical use of the X-ray imaging device 1 for X-ray photography in the medical imaging field in particular.

Figure 7:
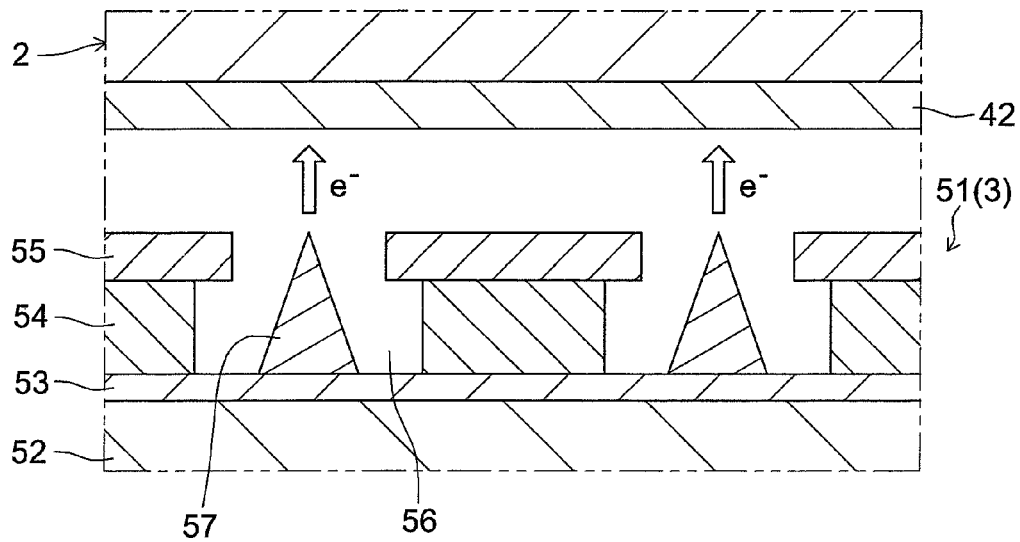
FIG. 7 is a schematic partially enlarged cross sectional view of a Spindt-type electron source.
Figure 8:
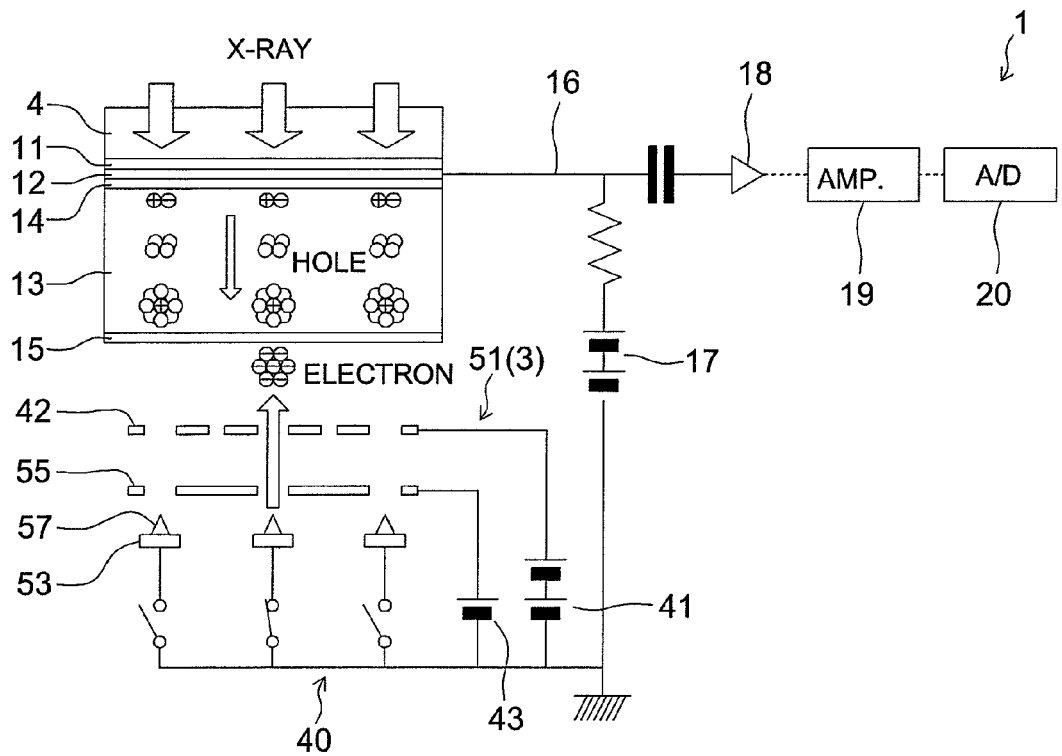
FIG. 8 is an explanatory view showing an operation principle of the X-ray imaging element with a cold electron source being a Spindt-type electron source.

FIGS. 7 and 8 show the more specific configuration of the X-ray imaging device 1 in this embodiment with a Spindt-type electron source 51, which is a cold cathode field emission-type electron source, being employed as the cold electron source 3. In FIGS. 7 and 8, component members similar to those in FIGS. 3 to 6 are designated by similar reference signs.

The Spindt-type electron source 51 has a plurality of belt-like cathode electrodes 53 formed on a substrate 52 which is made of glass and the like, and a plurality of belt-like gate electrodes 55 formed on the cathode electrodes 53 with an insulating layer 54, which is made of $SiO_2$ and the like, interposed therebetween. A large number of fine pores 56 are formed in the gate electrode 55 and the insulating layer 54. In each fine pore 56, an emitter 57 having a sharpened tip part protruding from the cathode electrode 53 is provided. The cathode electrodes 53 and the gate electrodes 55 extend in the direction orthogonal to each other, and intersections between the cathode electrodes 53 and the gate electrode 55 function as electron emission sections 3a as shown in FIGS. 1 and 2. The number of emitters 57 included in the intersection of each cathode electrode 53 and gate electrode 55 may be any number as long as it is one or more. The switching circuit 40 sequentially switches a voltage applied to between the cathode electrode 53 and the gate electrodes 55 from the voltage application circuit 43, by which the address of each pixel is executed.

When voltage is applied to between the cathode electrode 53 and the gate electrode 55 by the voltage application circuit 43, an electric field concentrates at the sharpened top end of the emitter 57, and electrons are emitted toward the electrode 42. The electrode 42 is a grid-like or mesh-like electrode for accelerating the electrons, and voltage is applied thereto by the voltage application circuit 41. The electrons emitted from the emitter 57 reaches the second charge injection blocking layer 15 of the X-ray detection section 2 through the electrode 42.

Since the Spindt-type electron source 51 can be manufactured by a semiconductor device manufacturing technology, very fine processing can be applied thereto, so that a large number of electron source elements can be formed with high density. Therefore, employing the Spindt-type electron source 51 as a cold electron source makes it possible to form the electron source element, which constitutes a pixel in X-ray photography, with high density, so that a very high definition X-ray photography image can be provided.

Second Embodiment

Figure 9:
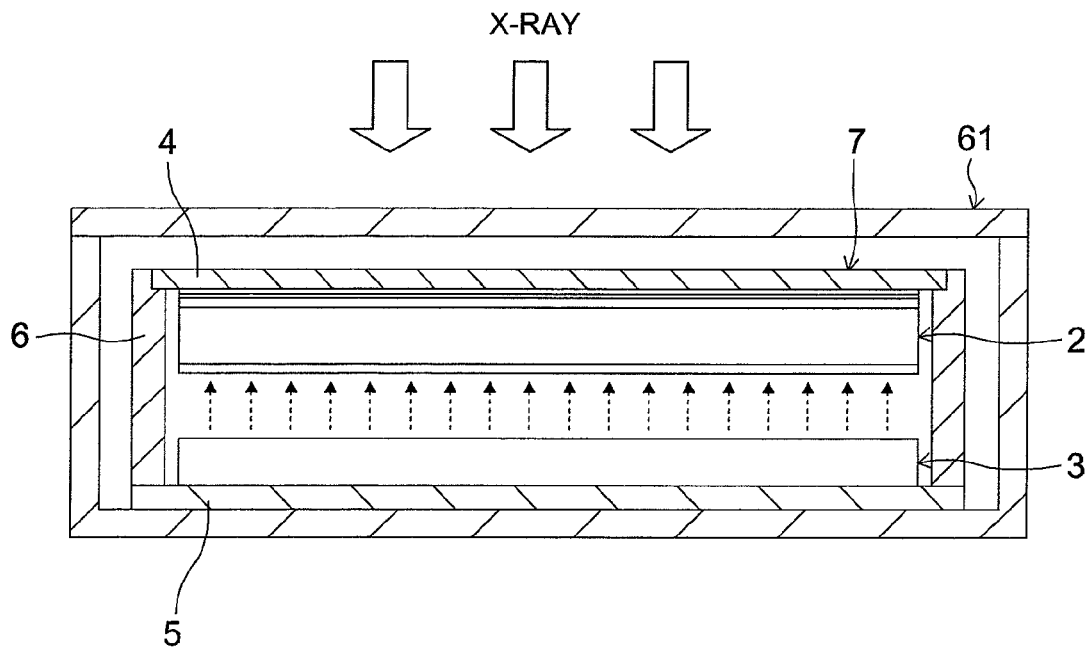
FIG. 9 is a schematic cross sectional view of an X-ray imaging device according to a second embodiment of the invention.

An X-ray imaging device 1 according to the second embodiment of the invention shown in FIG. 9 is different from the first embodiment in the configuration of shielding visible light from entering into the X-ray detection section 2. More specifically, in this embodiment, the X-ray imaging device 1 is accommodated in a light-shielding casing 61 which is made of a light-shielding material. As the light-shielding material, such materials as beryllium, ceramics and aluminum can be used for example. Employing the light-shielding casing 61 facilitates disassembly and repair of the X-ray imaging device 1. Moreover, X-ray filters and the like can easily be detached and replaced according to photographing conditions such as X-ray intensity.

Since other structures and functions of the second embodiment are similar to those of the first embodiment, like component members are designated by like reference signs to omit description.

Third Embodiment

Figure 10:
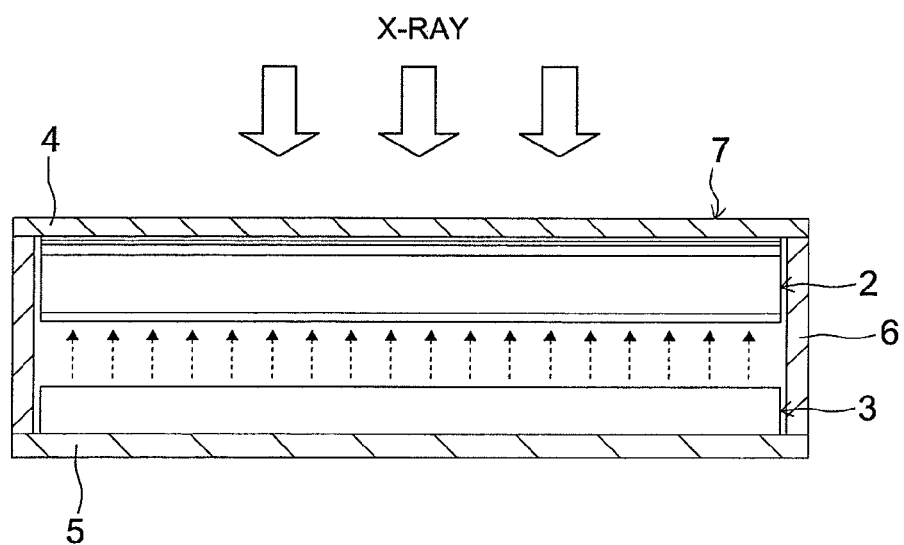
FIG. 10 is a schematic cross sectional view of an X-ray imaging device according to a third embodiment of the invention.

An X-ray imaging device 1 according to the third embodiment of the invention shown in FIG. 10 is also different from the first embodiment in the configuration of shielding visible light from entering into the X-ray detection section 2. More specifically, a device casing 7 itself of the X-ray imaging device 1 is provided with a light shielding effect in this embodiment. More specifically, a face plate 4, a base plate 5 and a side plate 6, which constitute the device casing 7, are all made of materials which transmit an X-ray but block visible light. For example, the face plate 4 and the base plate 5 may be made of aluminum, and the side plate 6 may be made of ceramics.

Since other structures and functions of the third embodiment are similar to those of the first embodiment, like component members are designated by like reference signs to omit description.

Next, with reference to FIG. 11, a voltage value applied to the X-ray detection section 2 of the X-ray imaging device 1 will be explained in detail. It is necessary to generate an electric field with intensity high enough to induce avalanche multiplication in the X-ray conversion layer 13 of the X-ray detection section 2 as mentioned before. Therefore, the voltage value applied to the X-ray detection section 2 by the voltage application circuit 17 needs at least to fulfill this condition. Particularly, it is preferable to set the voltage value applied to the X-ray detection section 2 by the voltage application circuit 17 so that an average electric field of between $0.1 \times 10^8$ V/m and $0.6 \times 10^8$ V/m is generated in the X-ray detection section 2. The reason thereof will be described below.

Figure 11:
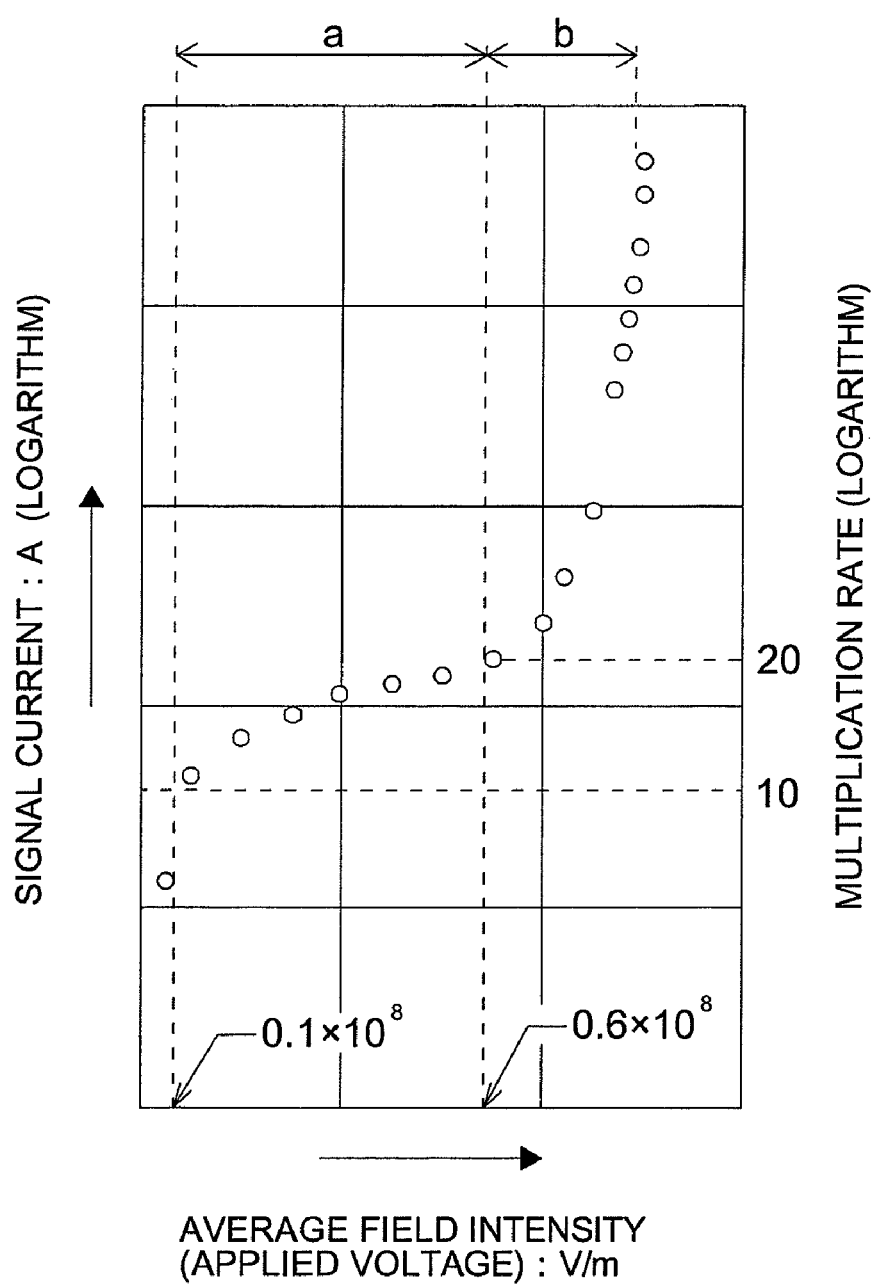
FIG. 11 is a diagrammatic view showing change in signal current and change in magnification with respect to applied voltage to the X-ray detection section in the X-ray imaging device according to the invention.

FIG. 11 is a characteristic diagram showing change in signal current and change in magnification with respect to applied voltage to the X-ray detection section 2 in the X-ray imaging device 1 of the invention. In FIG. 11, a region "a" represents a range of an average electric field of between $0.1 \times 10^8$ V/m and $0.6 \times 10^8$ V/m, whereas a region "b" represents a range of an average electric field over $0.6 \times 10^8$ V/m. As is understood from FIG. 11, a multiplication factor of an output signal changes depending on the intensity of an average electric field, and a signal current increases rapidly in the region "b" where the average electric field exceeds $0.6 \times 10^8$ V/m. This is because the effect of the avalanche multiplication phenomenon becomes noticeable. In the usual ultrahigh sensitivity imaging camera for visible light (HARP camera), ultrahigh sensitivity photographing is implemented by utilizing this phenomenon.

However, in the region "b" where slight change in average field intensity (applied voltage) drastically changes the signal current (multiplication factor), it is necessary to control the applied voltage with extremely high precision in order to obtain a stabilized multiplication factor.

Contrarily, in the region "a", the multiplication factor of about tenfold or more and twentyfold or less is secured although it is lower than that of the region "b". As compared to the multiplication factor of, for example, a common X-ray imaging device which can only obtain a signal current of 1 time or less with respect to an input signal (X-ray energy), the multiplication factor of the region "b" is a value which can implement sufficiently high sensitivity. Moreover, as compared to the region "b", the region "a" has extremely small change in the multiplication factor with respect to the change in the average field intensity. Therefore, in the region "a" where the average field intensity of the X-ray detection section 2 is between $0.1 \times 10^8$ V/m and $0.6 \times 10^8$ V/m, the multiplication factor of tenfold or more and twentyfold or less can be obtained and stable multiplication can be achieved without high-precision control on applied voltage. In other words, if the X-ray imaging device 1 of the invention is used in the applied voltage range in which the average field intensity of the X-ray detection section 2 is within the range of the region "a", the X-ray imaging device can be controlled with practical operating voltage while high sensitivity is secured.

Figure 12:
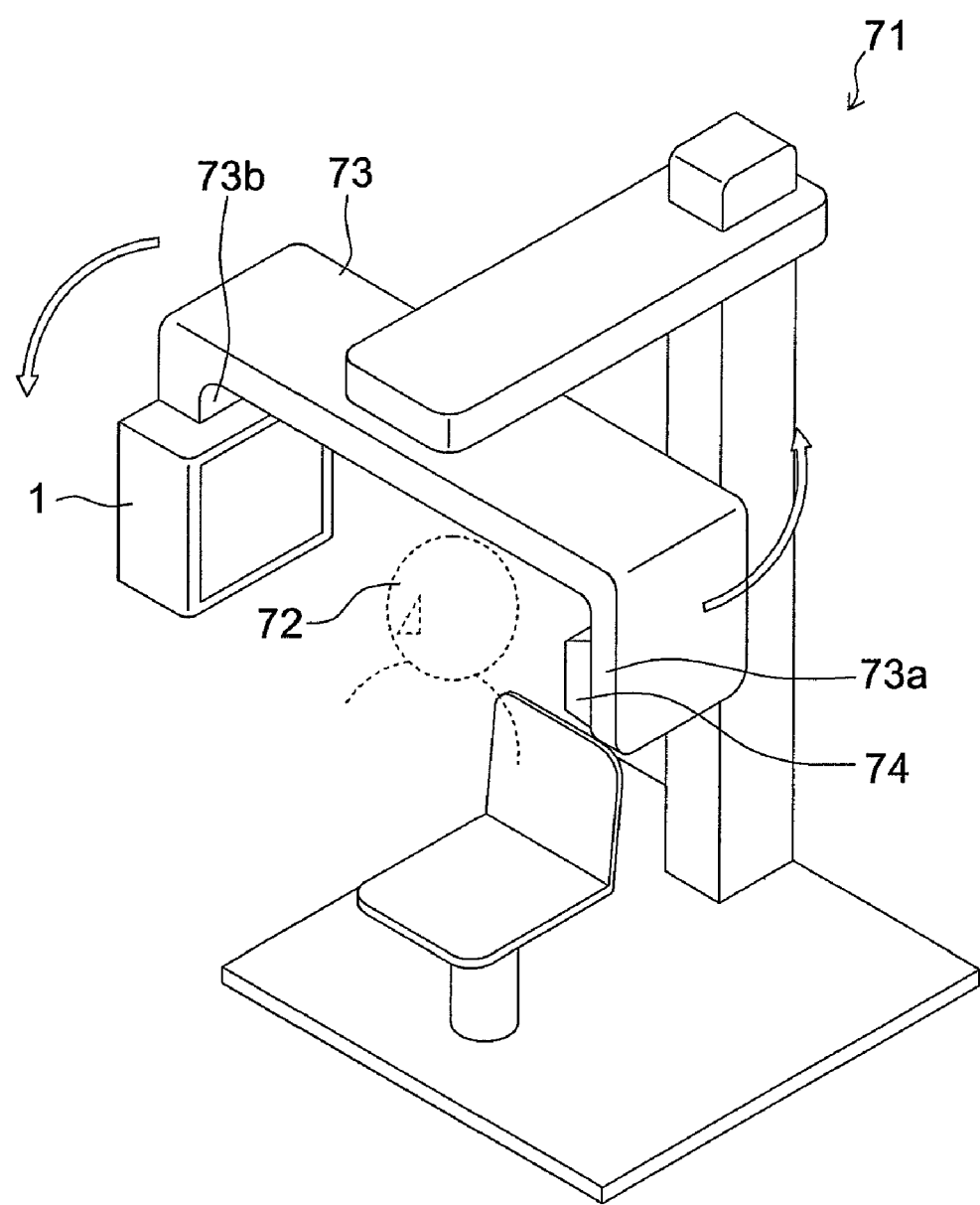
FIG. 12 is a schematic perspective view showing an X-ray radiographic apparatus having the X-ray imaging device according to the invention.
Figure 13:
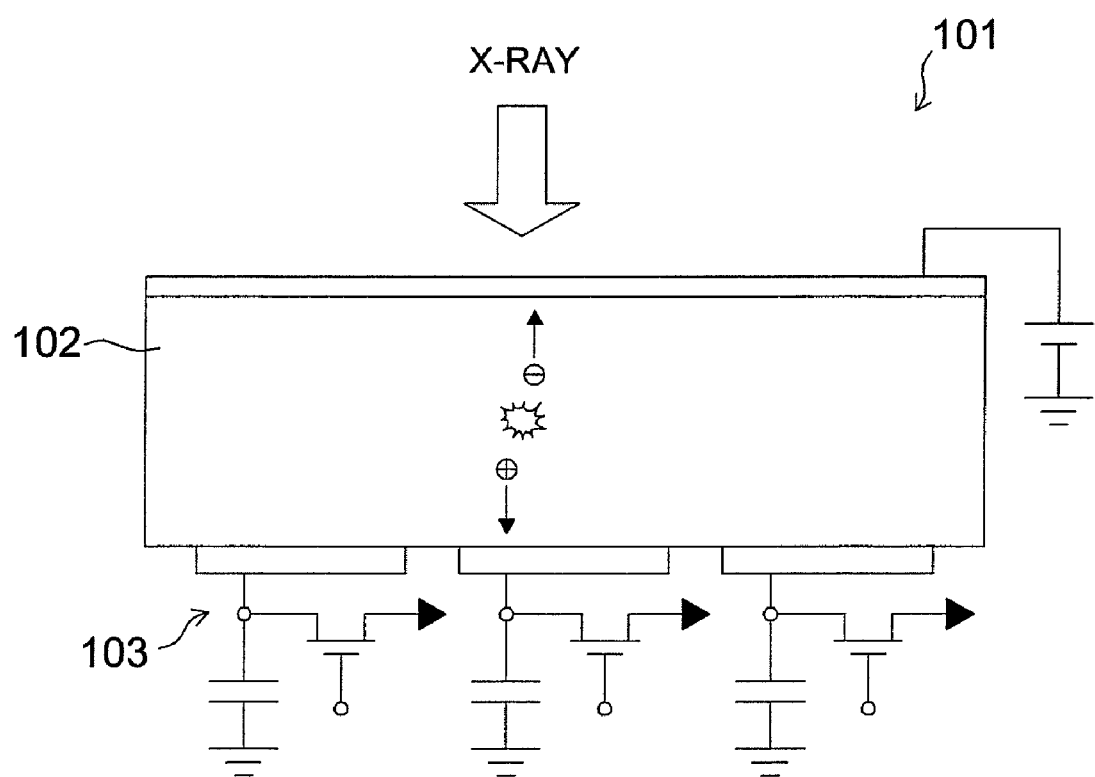
FIG. 13 is a schematic cross sectional view showing an example of a conventional X-ray imaging device.

FIG. 12 shows an X-ray radiographic apparatus 71 for dentistry as an example of a medical X-ray radiographic apparatus having the X-ray imaging device 1 of the invention. The X-ray radiographic apparatus 71 for dentistry has a rotary arm (moving section) 73 having an irradiation section 73a and an image pickup section 73b which face each other across a head 72 of a subject that is a photographing target. The rotary arm 73 rotates around an axis extending in a perpendicular direction as shown by an arrow in FIG. 11 by an unshown drive mechanism. The irradiation section 73a has an X-ray source 74. The image pickup section 73b is equipped with an X-ray imaging device 1 of the invention. The X-ray imaging device 1 may be any one of the devices in the first to third embodiments, and the cold electron source 3 (see FIG. 1) may also be of either the ballistic electron surface emission type or the Spindt type.

When the rotary arm 73 is set to an initial position and the X-ray radiographic apparatus 71 for dentistry is operated, X-ray irradiation from the X-ray source 74 is started, and an irradiated X-ray transmits the head of a subject and enters into the X-ray imaging device 1. The X-ray imaging device 1 moves with the rotation of the rotary arm 4 in the arrow direction, and an extensive X-ray image of a teeth jaw part of the subject is photographed.

Since the X-ray imaging device 1 of the invention has high sensitivity as described before, it becomes possible to substantially reduce the time taken for X-ray photography with the X-ray radiographic apparatus 71 for dentistry. As a result, the X-ray exposure of a subject can be reduced considerably.

As mentioned above, the X-ray imaging device according to the invention has an effect of achieving extremely high X-ray sensitivity and substantial reduction in the exposure of a subject at the time of photographing by combining the X-ray detection section having charge injection blocking films formed on both sides of an X-ray converter material and the cold cathode field emission-type electron source.

The invention is not limited to the embodiments disclosed but accommodates various deformations. For example, cold electron sources other than the ballistic electron surface-emitting device and the Spindt-type electron source may be employed. For example, cold electron sources such as silicon emitters, transistor structure emitters, surface conduction electron emitters, hot electron emitters with MIM (Metal-Insulator-Metal) structure or MIS (Metal-Insulator-Semiconductor) structure, and carbon nanotube emitters may be employed

INDUSTRIAL APPLICABILITY

The X-ray imaging device of the invention is suitable as an X-ray imaging device used for X-ray photography in the medical diagnosis field such as for medical department and dental department. More specifically, the X-ray imaging device of the invention is suitable as an X-ray imaging device for use in radiography tables, tomography, angiography including DSA (Digital Subtraction Angiography), IVR (Interventional Radiology), 3D angio, panoramic radiography, CT photographing or the like.

The invention claimed is:

1. An X-ray imaging device, comprising:
   an X-ray detection section including (i) an X-ray conversion layer having a first surface into which an X-ray enters and a second surface opposite to the first surface and made of an X-ray converter material for generating electric charges upon an incidence of the X-ray, (ii) a first charge injection blocking layer formed on the first surface of the X-ray conversion layer, and (iii) a second charge injection blocking layer formed on the second surface of the X-ray conversion layer;
   a cold electron source having a plurality of electron emission sections arranged in a matrix form, each of the electronic emission sections being capable of emitting electrons toward the second charge injection blocking layer of the X-ray detection section;
   a light-shielding section for shielding visible light from entering into the X-ray detection section;
   a voltage application section for applying a voltage to the X-ray conversion layer of the X-ray detection section to generate an electric field which induces avalanche multiplication;
   an electron source drive section for driving the plurality of electron emission sections of the cold electron source in sequence so that the electrons are emitted; and
   a read section for electronically detecting the electric charges generated by the incidence of the X-ray into the X-ray conversion layer and then neutralized by the electrons emitted from the plurality of electron emission sections,
   wherein the voltage application section generates an average electric field of between $0.1 \times 10^8$ V/m and $0.6 \times 10^8$ V/m in the X-ray conversion layer of the X-ray detection section.

2. The X-ray imaging device according to claim 1, wherein the X-ray converter material includes amorphous selenium.

3. The X-ray imaging device according to claim 1, wherein the cold electron source is a ballistic electron surface-emitting device.

4. The X-ray imaging device according to claim 1, wherein the cold electron source is a Spindt-type electron source.

5. The X-ray imaging device according to claim 1, wherein the light-shielding section is a light-shielding coating layer made of a light-shielding resin material, the light-shielding coating layer being formed so as to cover at least the first surface of the X-ray conversion layer of the X-ray detection section into which the X-ray enters.

6. The X-ray imaging device according to claim 1, wherein the light-shielding section is a light-shielding casing made of a light-shielding material for housing at least the X-ray detection section and the cold electron source therein.

7. An X-ray radiographic apparatus, comprising:
an X-ray imaging device;
a moving section for spatially moving the X-ray imaging device; and
an X-ray irradiation section placed on an opposite side of the X-ray imaging device with respect to a photographing target for irradiating the photographing target with a transmitted X-ray and making the transmitted X-ray enter into the X-ray imaging device,
wherein the X-ray imaging device comprises:
an X-ray detection section including (i) an X-ray conversion layer having a first surface into which the X-ray enters and a second surface opposite to the first surface and made of an X-ray converter material for generating electric charges upon an incidence of the X-ray, (ii) a first charge injection blocking layer formed on the first surface of the X-ray conversion layer, and (iii) a second charge injection blocking layer formed on the second surface of the X-ray conversion layer;
a cold electron source having a plurality of electron emission sections arranged in a matrix form, each of the electronic emission sections being capable of emitting electrons toward the second charge injection blocking layer of the X-ray detection section;
a light-shielding section for shielding visible light from entering into the X-ray detection section;
a voltage application section for applying a voltage to the X-ray conversion layer of the X-ray detection section to generate an electric field which induces avalanche multiplication;
an electron source drive section for driving the plurality of electron emission sections of the cold electron source in sequence so that the electrons are emitted; and
a read section for electronically detecting the electric charges generated by the incidence of the X-ray into the X-ray conversion layer and then neutralized by the electrons emitted from the plurality electron emission sections, and
wherein the voltage application section generates an average electric field of between $0.1 \times 10^8$ V/m and $0.6 \times 10^8$ V/m in the X-ray conversion layer of the X-ray detection section.

8. The X-ray radiographic apparatus according to claim 7, wherein the cold electron source is a ballistic electron surface-emitting device.

9. The X-ray radiographic apparatus according to claim 7, wherein the cold electron source is a Spindt-type electron source.

10. The X-ray radiographic apparatus according to claim 7, wherein the light-shielding section is a light-shielding coating layer made of a light-shielding resin material, the light-shielding coating layer being formed so as to cover at least the first surface of the X-ray conversion layer of the X-ray detection section into which the X-ray enters.

11. The X-ray radiographic apparatus according to claim 7, wherein the light-shielding section is a light-shielding casing made of a light-shielding material for housing at least the X-ray detection section and the cold electron source therein.

* * * * *